PRECISION SWEPT OSCILLATOR

Filed Dec. 9, 1966 2 Sheets-Sheet 1

THOMAS L. LOPOSER
GORDON D. McKINLEY
BY Glenn H. Antrim
AGENT

THOMAS L. LOPOSER
GORDON D. McKINLEY
INVENTORS
BY Glenn H. Antrim
AGENT

United States Patent Office 3,364,437

Patented Jan. 16, 1968

3,364,437

PRECISION SWEPT OSCILLATOR

Thomas L. Loposer, Greenville, and Gordon D. McKinley, Richardson, Tex., assignors to LTV Electrosystems, Inc., Greenville, Tex., a corporation of Delaware Continuation-in-part of application Ser. No. 481,290, Aug. 20, 1965. This application Dec. 9, 1966, Ser. No. 621,081

6 Claims. (Cl. 331—1)

This application is a continuation-in-part of our prior application entitled, "Precision Swept Oscillator," Ser. No. 481,290, filed Aug. 20, 1965, now abandoned.

This invention pertains to sweep frequency oscillators or generators, and particularly to sweep frequency oscillators that provide accurately controlled end frequencies for determining selected ranges and accurately controlled rates of sweep or frequency change within the selected ranges.

Prior sweep oscillator circuits may be said to be open-end circuits in which the values of circuit components are chosen so that the changes in frequency during sweep cycles are substantially linear between the chosen end frequencies. The accuracy retained during long periods of operation depends upon the stability of the components. Usually, exact linearity is not achieved in these open-end control circuits in which linearity is to be dependent upon changes in control voltage at a predetermined rate to control rate of change of frequency.

The present circuit differs from prior circuits in that digital-controlled closed-loop circuits rather than open-ended circuits are utilized for controlling rates of frequency change. A closed-loop control circuit of this invention utilizes output signal during sweep cycles to control the voltage applied to the voltage-controlled oscillator at closely spaced intervals during sweep cycles. The control circuit includes a digital counter that functions as a frequency divider. Usually, the oscillator signal is swept so that the rate of change during sweep cycles is linear, but predetermined gradual non-linear sweep characteristics may be obtained when desired. The accuracy of the frequency control at any time during any sweep cycle is equivalent to the frequency stability that is expected from a good quartz crystal oscillator that is operated at room temperature.

A sweep-frequency oscillator according to this invention has many applications where extremely linear operation is desired. It may be used for laboratory tests, for spectrum analysis, or for providing local oscillator signals in search or acquisition receivers.

An object of this invention is to control accurately the frequencies of output signals of sweep-frequency oscillators at all times during entire sweep cycles.

Another object is to provide in a closed control loop, a frequency divider that is controlled by start and stop end frequency control circuits and rate control circuits to control sweep frequencies accurately.

A feature of this invention is the utilization of a digital counter as a frequency divider in an oscillator frequency control loop.

Other objects and advantages will be apparent from the specification and claims and the accompanying drawing illustrative of the invention in which:

Figure 1:
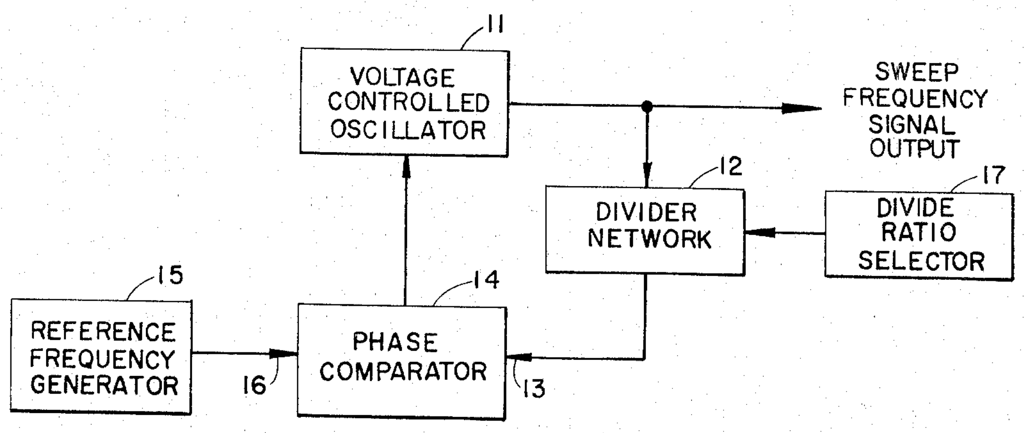
FIGURE 1 is a simplified block diagram of the invention.

Referring to FIGURE 1, there is shown a conventional voltage controlled oscillator 11 having a feedback loop including a divider network 12, a phase comparator 14, and a reference frequency generator 16. Systems such as this are well known to those skilled in the art; for example, Edward M. Ulicki discussed a similar system at the 19th Annual Symposium on Frequency Control (1965), as reported in the Proceedings for that Symposium.

The divider network 12 is basically a counter that produces an output signal pulse for a preset number of cycles generated at the output of the oscillator 11. If the oscillator 11 generates a sinusoidal wave, the divider 12 would include circuitry to square the sinusoidal shape and generate a pulse for each cycle of the oscillator output. The output pulses from the divider network 12 are connected to input 13 of the phase comparator 14; the phase comparator also received a train of pulses at its input 16 from the reference frequency generator 15. The number of cycles required at the output of the oscillator 11 to produce a pulse at the output of the divider network 12 is determined by a divider ratio selector 17.

The phase comparator 14 can be any one of many well known such devices. For example, one well known phase comparator includes means to generate a linear ramp voltage; the ramp generator is started by a pulse from the reference frequency generator 15 and is stopped by a pulse from the divider network 12. Thus, the magnitude of the ramp voltage is proportional to the time difference, which is also the phase difference, between the pulses generated at terminal 13 and the pulses generated at terminal 16. The ramp voltage is connected to the control circuit of the oscillator 11 to vary the feedback signal of the oscillator circuit.

The voltage controlled oscillator 11 is a basic well known device. It generates an alternating output signal the frequency of which is dependent upon a control signal, usually connected to the oscillator feedback loop, to change the feedback reactance. For a given value of control voltage, the frequency of the output signal will remain constant at some predetermined value. If the control voltage, in this case from the phase comparator 14, is changed the output signal frequency will immediately begin to adjust to the new value established by the new control signal. The rate of frequency change is determined by the gain of the feedback loop, the gain being defined broadly as a function of the sampling rate (the frequency of the output signal of the frequency divider) and the transfer functions of all circuits within the feedback loop. If the gain is low, the change of frequency of the oscillator 11 in response to change in divide ratio of divider network 12 is slow and approaches its ultimate value asymptotically. If the gain is high, and especially when phase delay in the feedback circuit is substantial, the charge on the capacitor that is in the control circuit initially changes more than is necessary to effect a required change in frequency. A curve for frequency change therefore shows a damped oscillatory waveform for each abrupt change of frequency. When the gain is optimum, the change in frequency is effected quickly and the desired frequency is approached asymptotically.

Figure 2:
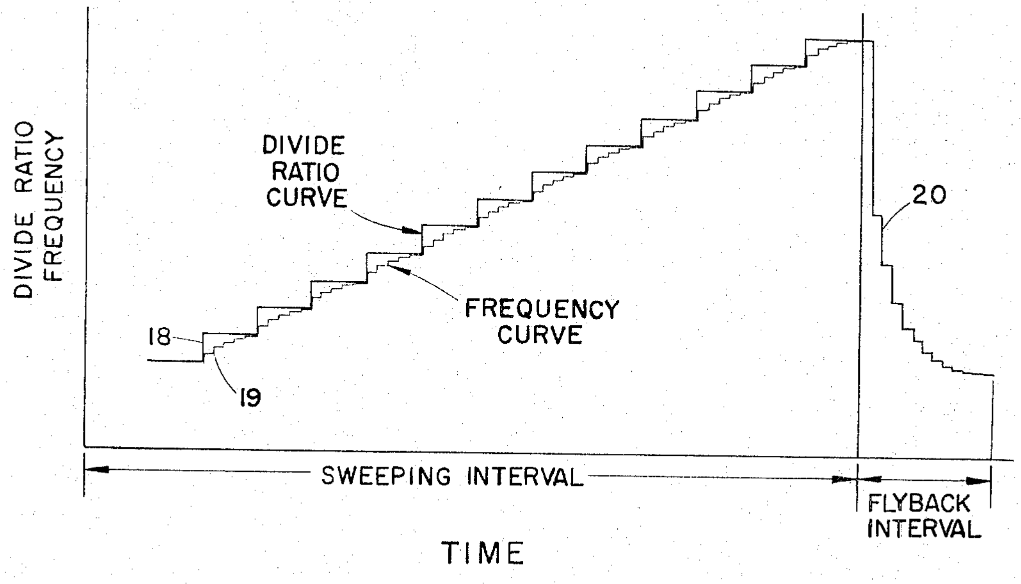
FIGURE 2 is a graph to show change in frequency caused by change in divide ratio in the control loop of the oscillator of this invention.

The rate of change in frequency as a result of change in divide ratio is illustrated in FIGURE 2. The lowest point on the curve represents a start frequency that corresponds to an initial preselected divide ratio of a counter that is used for the divider network 12. When the preselected divide ratio is maintained constant, the frequency of the output signal of the sweep frequency generator also remains constant. Under constant conditions, the time difference between the occurrence of the divider network 12 output pulse and the reference frequency generator 15 output pulse is constant. The voltage that is transferred from the phase comparator voltage ramp to the capacitor in the control circuit of the voltage controlled oscillator 11 remains constant at a value to cause the output signal of the oscillator to be equal to the frequency of the reference signal multiplied by the number of counts in each counting cycle of the counter of the divider network 12.

The portion 18 of the divide ratio curve of FIGURE 2 represents a change in the presetting of the divider network 12 so that a greater number of cycles of the output signal are counted during each counting cycle. At this point in time there exists a frequency difference between the command frequency as set by the new divide ratio and the actual output frequency of the voltage controlled oscillator 11. The pulses at the output of the divider network then occur at later points on the phase comparator voltage ramp. The voltage that is transferred from the voltage ramp to the control circuit of the oscillator 11 is increased for each successive count corresponding to the changes in frequency as represented by the steplike portion 19 of the frequency curve of FIGURE 2. Each step occurs at each sampling period that corresponds to a counting cycle. As shown in FIGURE 2, the change in frequency in response to a change in divide ratio is greatest at the end of a first counting cycle when the frequency difference between the command frequency and the actual frequency is greatest. The changes in control voltage cause the frequency of the oscillator to change in the required direction to decrease the difference in the frequency of the output of the divider network 12 and the frequency of the output of the reference frequency generator 15. The steplike changes in oscillator control voltage gradually become smaller as the frequency error decreases. As described above, when a desired time constant is selected for the frequency control circuit, the desired frequency is approached asymptotically so that the frequency control circuit is stable.

The sweep illustrated in FIGURE 2 is essentially linear. The divide ratio of the divider network 12 is increased periodically to maintain an essentially constant frequency error in the loop. Usually, the number of counting cycles for each change in divide ratio is large so that the change of frequency for each counting cycle is small, and the control of the sweep follows very accurately the programming of the counter. The presetting of divider network 12 is changed repeatedly during the sweep period while the step-like changes in control voltage are still substantial. When the frequency of the oscillator 11 reaches a selected stop frequency, the divider network 12 is again preset to correspond to the start frequency. A flyback interval is required to permit the charge on the capacitor of the frequency control circuit to change the relatively substantial amount between the value required for the stop frequency and the value required for the start frequency. The changes in voltage on the control capacitor becomes less for successive counting cycles as illustrated by the corresponding frequency changes in a portion 20 of the frequency curve, and the frequency gradually approaches the start frequency. The interval must be long enough to ensure that the frequency of the oscillator has been returned accurately to a predetermined start frequency before the counter is again programmed for a sweep cycle.

Figure 3:
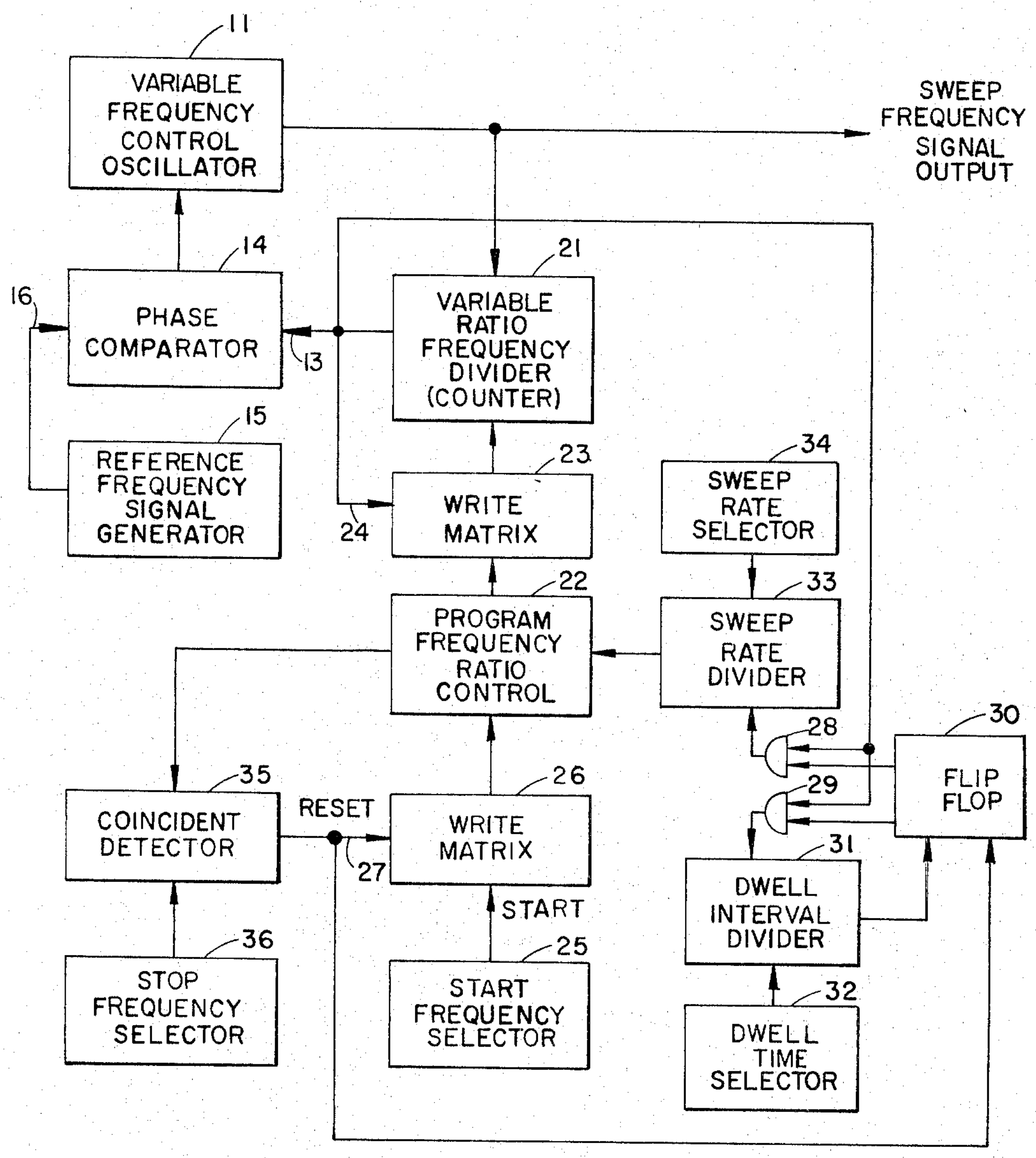
FIGURE 3 is a block diagram of the sweep frequency oscillator of this invention.

In accordance with the present invention, the divide ratio selector 17 is replaced by a program system that controls the frequency of the oscillator 11 to sweep from some starting value to an upper limit and return to commence again, as shown in FIGURE 2. The block diagram of FIGURE 3 shows a preferred system for programming the pulse train generated at terminal 13 of the phase comparator 14. A variable ratio frequency divider 21 replaces the divider network 12 and the divide ratio selector 17 of FIGURE 1. Again, if the oscillator 11 generates a sinusoidal wave the frequency divider 21 would incorporate circuitry to square the sinusoidal shape and generate a pulse for each cycle of the oscillator output. The variable ratio frequency divider 21 consists of what is commonly known as a ripple through counter consisting of a plurality of serially connected flip-flops. The flip-flop circuits are usually connected such that it requires a given number of input pulses at the first flip-flop to produce one output pulse from the last flip-flop. In the present circuit, the input pulses are the squared waves from the oscillator 11. By eliminating, electrically that is, some of the serially connected flip-flop circuits the number of input pulses required to produce an output pulse can be varied. Thus, if the input to the first flip-flop in the divider 21 is a pulse train representing the frequency output of the oscillator 11 the output of the divider is a pulse-train equal to some fraction of the input. The output pulse train from the divider 21, in addition to connecting to terminal 13 of the phase comparator 14, also connects to a write gate 23 by means of a line 24 and to two AND gates 28 and 29. The write gate 23 receives a binary coded signal, assuming the system operates on a binary code, from a program frequency ratio control 22, and transfers the information received from the ratio control to the flip-flop control terminals of the frequency divider 21. The program frequency ratio control 22 has two input channels and an output channel; one input channel connects to a sweep rate divider 33 and the second input channel connects to a write gate 26. The output channel of the ratio control 22 connects to a coincident detector 35 and to the write gate 23.

The sweep rate divider 33 also has two input channels, one connected to a sweep rate selector 34 and the other connected to the AND gate 28. The AND gate 28 has two input signals, one from the frequency divider 21, as mentioned previously, and the second from a flip-flop 30. Flip-flop circuits normally have two ouput signals; the flip-flop 30 has one output connected to the AND gate 28 and the second connected to the AND gate 29. The output of the AND gate 29 connects to a dwell interval divider 31; the dwell interval divider receives a second input signal from a dwell time selector 32. The output of the dwell interval divider 31 connects to the flip-flop 30 which also receives an input signal from the coincident detector 35. The coincident detector output signal also connects to the input of the write gate 26 which receives information from a start frequency selector 25. Finally, to complete the system, the coincident detector 35 is connected to a stop frequency selector 36.

In operation, the start frequency selector 25 generates a binary coded signal representing the lowest frequency which it is desired to have generated by the variable frequency control oscillator (VFO) 11. There are any number of available circuits that can be used as a start frequency selector; for example, a simple power source supplying a fixed voltage to a plurality of wafer switches connected to a diode matrix would be adequate. The wafer switches would be set to either on or off and thereby generate the desired binary code at the output of the start frequency selector 25.

To start the VFO 11 generating the frequency curve shown in FIGURE 2 a reset signal is generated on line 27. This signal closes the plurality of gates (each gate being an AND circuit) of the write gate 26 thereby transferring the binary code generated by the frequency selector 25 to the program frequency ratio control 22. Write gates are familiar devices and usually are made up of a plurality of AND gates having one common input; in this case, the common input is the reset signal generated on the line 27. The program frequency ratio control 22 is simply a register consisting of a plurality of serially connected flip-flop circuits each having two stable states. Each bit in the binary code generated in the start selector 25 presents one flip-flop in the ratio control 22. As presently employed, the program frequency ratio control 22 acts as a storage means for the information transferred thereto.

The information stored in the ratio control 22 is available to the coincident detector 35, this will be discussed presently, and also transferred through the write gate 23 to the variable ratio frequency divider 21. To transfer information through the write gate 23 a transfer pulse must be present on the line 24. Like the write gate 26, the write gate 23 is simply a plurality of AND gates having one common input. The variable ratio frequency divider 22 receives the information transferred through the write gate 23 to preset the flip-flop circuits of the register in the frequency divider. By presetting a given arrangement of flip-flop circuits, the number of input pulses required from the VFO 11 to produce an output pulse at terminal 13 can be either increased or decreased. Thus, the binary code transferred from the start frequency selector 25, through the write gate 26 to the program frequency ratio control 22, through the write gate 23 to the variable ratio frequency divider 21, determines the number of pulses, that is the number of cycles at the output ofthe VFO 11, required to produce an output pulse at the terminal 13. The pulse train output of the frequency divider 21 is compared in the phase comparator 14 for the phase difference between the reference pulse train generated by the reference frequency signal generator 15, as explained previously. In addition, the pulse train output of the frequency divider 21 pulses the write gate 23 to transfer the binary code of the program frequency ratio control 22 to the frequency divider 21. Further, the pulse train output of the frequency divider 21 is supplied to the AND gate 28 as one input thereto.

When an AND gate has two identical input signals (commonly known as a logic ONE) it generates an output signal that is also a logic ONE. The AND gate 28 has one input signal from the flip-flop 30 and the second input signal the pulse train from the frequency divider 21. Thus, so long as the flip-flop 30 generates a logic ONE output signal to the AND gate 28, the output of the gate is a pulse train identical to that generated at the output of the frequency divider 21. The output of the AND gate 28 operates the sweep rate divider 33 which is simply another register circuit containing a plurality of serially connected flip-flops. As explained previously with regards to the frequency divider 21, a register can be connected so that one output pulse is generated for a given number of input pulses by eliminating, that is presetting, any number of flip-flop circuits. The sweep rate selector 34 establishes the number of pulses from the AND gate 28 (cycles at the output of the VFO) that are required to produce an output pulse from the rate divider 33. In its simplest form, the rate selector 34 is a power source supplying a fixed voltage to a plurality of wafer switches connected to a diode matrix. By proper setting of the wafer switches the flip-flop circuits in the rate divider 33 are preset to thus vary the number of input pulses required to produce an output pulse.

Each pulse from the rate divider 33 changes the binary code stored in the ratio control 22 and thereby changes the factor by which the output frequency of the VFO 11 is divided. At the next pulse on line 24, the new code (dividing factor) is transferred from the ratio control 22 through the write gate 23 to the frequency divider 21. The new divide ratio is generated before the VFO 11 has time to establish the frequency called for by the previous divide ratio. As shown in FIGURE 2, the VFO 11 generates four cycles before a new divide ratio is established. This operation continues and the VFO 11 never levels out at a given frequency but always increases in a substantially linear manner as shown in FIGURE 2.

As mentioned previously, the binary code stored in the program frequency ratio control 22 is continuously available to the coincident detector 35. Coincident detectors usually comprise a plurality of AND gates and NOR gates connected in an array. The number of AND gates and NOR gates required would vary with the number of information bits in the signals to be compared. The coincident detector 35 compares the binary code from the frequency control 22 with a binary signal generated by the stop frequency selector 36 which is similar in construction and operation to the start frequency selector 25. The binary signal from the frequency selector 36 represents the upper frequency limit to be generated at the output of VFO 11, as shown in FIGURE 2.

The output of the coincident detector 35 closes the write gate 26 and again the start frequency code from the start frequency selector 25 is transferred to the frequency ratio control 22. Transferring the start frequency code to the ratio control 22 cancels frequency divide ratio then existing in the ratio control. Simultaneously with the closing of the write gate 26, the pulse output of the coincident detector 35 changes the flip-flop 30 from its first stable state to its second. Immediately upon transferring the start frequency code to the program ratio control 22 the output of the coincident detector 35 goes to zero since its two input signals are no longer identical. However, the flip-flop 30 remains in its second stable state as such devices normally operate in this manner. With the flip-flop 30 in its second stable state, its first output, connected to the AND gate 28, goes to logic ZERO and its second output, connected to the AND gate 29, changes from logic ZERO to logic ONE. Functionally the AND gate 29 is similar to the AND gate 28 and thus generates a logic ONE output for each pulse generated by the frequency divider 21. Since the AND gate 28 is now only receiving the pulse train from the frequency divider 21, its output will be a steady logic ZERO. As a result, the sweep rate divider 33 does not generate an output pulse to change the code, and the program frequency control 22 remains at the start frequency level. This means the frequency of the output of the VFO 11 will decrease in an attempt to reach the start frequency level. The number of cycles that are generated by the VFO 11 before it begins to increase is determined by the dwell time selector 32 connnected to the dwell interval divider 31.

The dwell interval divider 31 is similar to the sweep rate divider 33; it is simply a register consisting of a plurality of serially connected flip-flop circuits. In operation, the dwell divider 31 is similar to the sweep rate divider 33. A pulse train from the variable ratio frequency divider 21, through the AND gate 29, is connected to the dwell divider 31; the number of pulses from the frequency divider (cycles at the output of the VFO 11) required to cause an output pulse from the dwell divider 31 is determined by the dwell time selector 32. The dwell selector 32, like the sweep selector 34, is simply a plurality of wafer switches connected to a power supply and to a diode matrix to preset a given arrangement of flip-flops to thereby vary the number of input pulses to the dwell divider 31 that are required to produce an output pulse. Thus, if the dwell selector 32 is set at 12, it requires 12 pulse signals from the AND gate 29 (which corresponds to twelve cycles at the output of the variable ratio frequency divider 21) before a signal is generated at the output of the dwell divider 31. At the end of the 12 cycles, the dwell divider 31 generates an output pulse which changes the flip-flop 30 from its second stable state back to its first state. Again the logic ONE output from the flip-flop 30 is connected to the AND gate 28 and the signal from the flip-flop 30 the AND gate 29 would return to logic ZERO. The AND gate 28 would again pass the pulse train generated by the variable frequency divider 21 and the sequence of operation is repeated. The time during which the dwell interval divider 31 receives the output pulses from the variable ratio frequency divider 21 is defined as the flyback interval and is shown as such in FIGURE 2.

The above described operation would continuously repeat itself with the frequency output of the VFO 11 increasing along the line 19, of FIGURE 2, the divide ratio, that is the factor by which the VFO output is divided, increasing along the curve 18. When the frequency reaches its upper limit, the flyback interval is initiated during which time the output frequency reduces to its starting point as shown by the curve 20 of FIGURE 2.

It is not deemed necessary, as recognized by one skilled in the art of logic circuit design, to completely describe each of the many circuits used in the various components shown in FIGURES 1 and 3. Each of the various components is thoroughly described in many excellent texts; for example, reference is made to the text entitled "Digital Computer Components and the Circuits" by R. K. Richards, published by Van Nostrand.

While only one embodiment of the invention has been described in detail herein and shown in the accompanying drawing, it will be evident that various modifications are possible in arrangement and construction of its components without departing from the scope of the invention.

We claim:

1. A frequency-controlled oscillator having an input control circuit for controlling the frequency of the signal at the output of said oscillator, a counter having an input connected to the output of said frequency-controlled oscillator for counting the cycles of the output signal of said oscillator, means operating in response to said counter reaching a predetermined end count to reset said counter, control means connected between the output of said counter and said input control circuit of said oscillator, said control means operating in response to application of signal from said counter to control accurately the frequency of said oscillator as a predetermined ratio of the frequency of the output signal of said counter, said counter applying a cycle of signal to said control means in response to its reaching a final count during each of its counting cycles, presetting means connected to said counter for determining the number of counts in each of said counting cycles, and rate control means operating in cooperation with said presetting means to control the rate of change of the number of counts in successive ones of said counting cycles, thereby, to control accurately the rate of change of frequency during sweep cycles of said sweep frequency oscillator.

2. A sweep oscillator having a variable-frequency voltage-controlled oscillator, a phase comparator, and a counter, said counter having an input connected to the output of said variable-frequency voltage-controlled oscillator to count the successive cycles of the output signal of said controlled oscillator, a reference frequency signal generator, said comparator having one input connected to said reference frequency signal generator and another input connected to an output of said counter, the output of said comparator being connected to said variable-frequency voltage-controlled oscillator, said counter responding cyclically to application of output signal from said controlled oscillator to produce a signal for the final count of each of its counting cycles, means for presetting said counter to determine the number of counts in each of said counting cycles, the output frequency of said sweep oscillator being the frequency of the signal applied to said comparator from said reference frequency signal generator multiplied by said predetermined number of counts during a counting cycle, and means for changing a predetermined rate the number of counts in successive ones of said counting cycles to control accurately the change in frequency of the output of said sweep oscillator during each successive sweeping cycle of said oscillator as controlled by each successive counting cycle of said counter.

3. A sweep frequency oscillator having precisely controlled frequencies over a sweep range comprising:

a variable-frequency voltage-controlled oscillator circuit of the type that has a voltage-controlled oscillator and a phase comparator, said phase comparator responding to application of signal derived from said oscillator to control the frequency of the output signal of said oscillator circuit so that it is equal to a selected harmonic frequency of said reference signal, said oscillator circuit having a sub-harmonic counter connected between the output of said variable-frequency oscillator and said phase comparator to apply to said phase comparator said signal derived from said oscillator, said counter functioning as a variable-ratio frequency divider, said sub-harmonic counter providing an output signal at the end of each of its counting cycles to form a sub-harmonic signal that has a frequency that is equal to the frequency of said output signal of said oscillator divided by the number of counts that are made during each cycle of operation of said counter, said counter having presetting circuits for controlling the number of counts during each of its counting cycles, a write matrix having a write-signal input connected to receive said output signal of said sub-harmonic counter, a presetting digital output connected to said presetting circuits of said sub-harmonic counter, and a program input for determining said presetting digital output, said write matrix being responsive to application of said output signal of said sub-harmonic counter to preset said counter according to program information supplied to said input, a rate selector frequency divider connected to said counter to receive said output signal at the end of each of its counting cycles, said rate selector frequency divider having an output connected to said program input circuits of said write matrix, means for controlling said divider to select the ratio of the frequency of its input to the frequency of its output, and the rate of counting of said sub-harmonic counter during each of its cycles being controlled by the selected ratio of said divider during each of said cycles, whereby, said rate selector frequency divider determines the rate of counting of said sub-harmonic counter and thereby closely controls the rate of frequency change during each sweep cycle of said sweep frequency oscillator.

4. A sweep frequency oscillator including a variable-frequency voltage-controlled oscillator circuit of the type that has a voltage-controlled oscillator and phase comparator, said phase comparator responding to application of signal derived from said voltage-controlled oscillator and a reference signal to control the frequency of the output signal of said oscillator circuit so that it is equal to a selected harmonic frequency of said reference signal, a counter connected between the output of said variable-frequency oscillator and said phase comparator, said counter functioning as a variable-ratio frequency divider, said counter providing an output signal at the end of each of its counting cycles to form a sub-harmonic signal of said oscillator divided by the number of counts that are made during each cycle of operation of said counter, the frequency of said oscillator being controlled by said comparator so that the frequency of said sub-harmonic signal is equal to the frequency of said reference signal, counter control circuits connected to said counter, start frequency selector means responsive to a resetting signal for momentarily applying presetting information to said counter control circuits at the start of each counting cycle for determining the start frequency of the output signal of said sweep frequency oscillator, rate selector control means connected to said counter control circuits to determine the rate of change of count for successive cycles of operation of said counter, thereby, to determine the rate of frequency change of said output signal of said sweep frequency oscillator, and stop frequency control means connected to said counter control circuits and to said start frequency selector means, said stop frequency control means operating in response to said counter reaching a predetermined count that corresponds to the lowest frequency of the selected sweep range to apply said resetting signal to said start frequency selector means to restart the sweeping cycle of said sweep frequency oscillator.

5. A sweep frequency oscillator having precisely controlled selectable end frequencies and closely spaced controlled frequencies over a sweep range terminated by the end frequencies comprising:

a variable-frequency voltage-controlled oscillator circuit of the type that has a voltage controlled oscillator and phase comparator, said phase comparator responding to application of signal derived from said oscillator and a reference signal to control the frequency of the output signal of said oscillator circuit so that it is equal to a selected harmonic frequency of said reference signal, said oscillator circuit having a counter connected between the output of said variable-frequency oscillator and said comparator to apply to said phase comparator said signal derived from said oscillator, said counter operating as a digital variable-ratio frequency divider, a write matrix having a write signal input connected to receive said output signal of said counter, a presetting digital output connected to said presetting circuits of said counter, and a program input for determining said presetting digital output, said write matrix being responsive to application of said output signal of said oscillator to preset said counter according to program information applied to said program input, rate selector control means connected to said program input of said write matrix, said rate selector control means operable during a sweep period of said sweep frequency oscillator to change the count of said counter during its successive counting cycles, thereby to control accurately the rate of change of frequency of said sweep frequency oscillator, stop frequency control means operating in response to said write matrix presetting said counter to a predetermined final end count to provide a start resetting signal, thereby to determine the final end frequency of successive sweep cycles of said sweep frequency oscillator, start frequency selector means, start control means operable for momentarily connecting said start frequency selector means to said program input of said write matrix, said start control means having a control circuit connected to said stop frequency control means to receive said start resetting signal, and said start control means operating in response to operation of said stop frequency control means to determine the number of counts in a counting cycle at the beginning of each of said sweep cycles, thereby to control accurately the start frequency of said sweep cycles.

6. A sweep frequency oscillator having precisely controlled selectable end frequencies and closely spaced controlled frequencies over a sweep range terminated by the end frequencies comprising:

a variable-frequency voltage-controlled oscillator circuit of the type that has a voltage controlled oscillator and a phase comparator, said phase comparator responding to application of signal derived from said oscillator and a reference signal to control the frequency of the output signal of said oscillator circuit so that it is equal to a selected harmonic frequency of said reference signal, said oscillator circuit having a counter connected between the output of said variable-frequency oscillator and said comparator to apply to said phase comparator said signal derived from said oscillator, said counter operating as a digital variable-ratio frequency divider, a write matrix having a write signal input connected to receive said output signal of said counter, a presetting digital output connected to said presetting circuits of said counter, and a program input for determining said presetting digital output, and write matrix being responsive to application of said output signal of said oscillator to preset said counter according to program information applied to said program input, a program counting control circuit connected to said program input of said write matrix for transferring presetting information to said counter, a start-frequency selector, a sweep-rate control circuit, and a stop-frequency selector, write control means for connecting said start-frequency selector to said program counting control circuit, coincidence means connected to said program counting control circuit, to said stop-frequency selector, and to said write control means, said coincidence means responsive to said program counting control circuit reaching each final end count that is determined by the setting of said stop-frequency selector to reset said write control means and thereby to apply presetting information through said program counting control circuit to said write matrix for determining the start frequency of the output signal of said oscillator, said sweep-rate control circuit including a sweep-rate selector circuit, a dwell time selector circuit, and a switching circuit, said sub-harmonic counter being connected to said switching circuit to apply said output signal at the end of each of its counting cycles to said switching circuit, said switching circuit also being connected to said coincidence control means to receive an operating pulse in response to said program counting control circuit reaching each of said final end counts, said switching circuit being connected to said dwell time selector circuit and to said sweep-rate selector circuit, said switching circuit operating in response to the application of said operating pulse to apply said output signal of said sub-harmonic counter to said dwell time selector circuit, said dwell time selector circuit operating in response to reception of a preselected number of pulses of said output signal to operate said switching circuit to remove said output signal of said sub-harmonic counter from said dwell time selector circuit and to apply said output signal to said sweep-rate selector circuit, said sweep rate selector circuit being connected to said program counting control circuit, said sweep-rate selector circuit operating in response to application of said output signal to divide the repetition rate of said output signal by a preselected number that has been set into said sweep-rate selector circuit and applying the divided signal to said program counting control circuit, said program counting control circuit responding to application of said divided signal to advance the count of said preset digital output of said program counting control circuit that is applied to said sub-harmonic counter and to apply a count to said coincidence means until said end count is reached, whereby the end frequencies of said sweep range are determined by the settings of said start-frequency selector and said stop-frequency selector respectively and the rate of sweep within said sweep range is accurately controlled by operation of said sweep rate control circuit.

No references cited.

JOHN KOMINSKI, *Primary Examiner.*